(12) United States Patent
Heggemann et al.

(10) Patent No.: US 7,775,806 B2
(45) Date of Patent: Aug. 17, 2010

(54) ELECTRONIC HOUSING WITH A CONDUCTIVE PLATE

(75) Inventors: Christian Heggemann, Detmold (DE); Jens Oesterhaus, Detmold (DE); Matthias Boensch, Bielefeld (DE); Matthias Niggemann, Doerentrup (DE); Michael Lenschen, Detmold (DE); Stephan Fehling, Lage (DE); Torsten Diekmann, Leopoldshoehe (DE)

(73) Assignee: Weidmuller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/322,673

(22) Filed: Feb. 5, 2009

(65) Prior Publication Data
US 2009/0203234 A1      Aug. 13, 2009

(30) Foreign Application Priority Data
Feb. 11, 2008   (DE)   ...................... 10 2008 008 716

(51) Int. Cl.
   *H01R 1/00*   (2006.01)
(52) U.S. Cl. .................. 439/76.1; 439/716; 439/79; 361/752
(58) Field of Classification Search ............... 439/76.1, 439/716, 79, 535; 361/752, 730, 747
   See application file for complete search history.

(56) References Cited

U.S. PATENT DOCUMENTS

| | | | | |
|---|---|---|---|---|
| 5,469,332 A | * | 11/1995 | Alvite | ........................ 361/737 |
| 6,392,319 B1 | * | 5/2002 | Zebermann et al. | ......... 307/147 |
| 6,456,495 B1 | * | 9/2002 | Wieloch et al. | ............. 361/729 |
| 6,582,031 B2 | * | 6/2003 | Newton et al. | ................ 303/20 |
| 2006/0134946 A1 | * | 6/2006 | William Vermeersch | ... 439/76.1 |
| 2006/0234530 A1 | * | 10/2006 | Chung | .......................... 439/79 |
| 2007/0037417 A1 | * | 2/2007 | Katayanagi et al. | ........ 439/76.1 |
| 2007/0275577 A1 | * | 11/2007 | Masumori | .................. 439/76.1 |
| 2008/0045049 A1 | * | 2/2008 | Collantes et al. | ........... 439/76.1 |

* cited by examiner

*Primary Examiner*—Gary F. Paumen
(74) *Attorney, Agent, or Firm*—Lawrence E. Laubscher, Sr.; Lawrence E. Laubscher, Jr.

(57) ABSTRACT

A printed circuit board arrangement and method includes a planar generally-rectangular vertically-arranged printed circuit board having front and rear surfaces terminating in a peripheral edge, at least one of the front and rear surfaces having a conductive printed circuit thereon. The printed circuit board has a vertical side edge portion containing a recess, and arranged adjacent the recess is a fixed contact connected with a conductor portion of the printed circuit. A relatively narrow conductor housing arranged outside the peripheral edge of the printed circuit board is mounted in the recess with a movable contact carried by the housing in electrical engagement with the fixed contact. The connector housing is supported by a rear wall mounted on the rear surface of the printed circuit board, and by a resilient clip on the connector housing that engages the printed circuit board adjacent the recess.

13 Claims, 6 Drawing Sheets

ELECTRONIC HOUSING WITH A CONDUCTIVE PLATE

REFERENCE TO RELATED APPLICATIONS

This application is related to the Heggemann et al applications Ser. No. 12/320,856 filed Feb. 6, 2009, entitled "Connector Apparatus With Code Means, and Method of Assembling the Same", Ser. No. 12/320,854 filed Feb. 6, 2009, entitled "Housing for Electrical Components", and Ser. No. 12/322,889 filed Feb. 9, 2009, entitled "Stackable Electronic Housing With Male or Female Connector Strips".

BACKGROUND OF THE INVENTION

1. Field of the Invention

A printed circuit board arrangement and method includes a planar generally-rectangular vertically-arranged printed circuit board having front and rear surfaces terminating in a peripheral edge, at least one of the front and rear surfaces having a conductive printed circuit thereon. The printed circuit board has a vertical side edge portion containing at least one recess, and arranged adjacent said recess is a fixed contact connected with a conductor portion of the printed circuit. A relatively narrow conductor housing arranged outside the peripheral edge of the printed circuit board is mounted in the recess with a movable contact carried by the housing in electrical engagement with the fixed contact. The connector housing is supported by a rear wall mounted on the rear surface of the printed circuit board, and by resilient clip means on the connector housing that engages the printed circuit board adjacent the recess.

2. Description of Related Art

It has been known for a long time that one can solder conductor connections for the connection of electrical conductors directly upon a printed circuit board or, for example, in an automatic soldering process, that one can solder a pin strip with a housing for the connection of a corresponding jack strip upon a printed circuit board, and that one can install this printed circuit board in a conductor connection housing. Unfortunately, this prevents the arrangement from being relatively narrow, because the height of the printed circuit board and the height of the connections for the conductors unduly increase the thickness of the unit.

The present invention was developed to provide an improved printed circuit board connector arrangement that is relatively narrow on the one hand, but sturdy and inexpensive to manufacture on the other hand.

SUMMARY OF THE INVENTION

Accordingly, a primary object of the present invention is to provide an improved printed circuit board connector arrangement wherein external conductors are connected with circuits on a printed circuit board by movable connectors carried by relatively narrow connector housings arranged outside the peripheral edge profile of the printed circuit board.

According to a more specific object of the invention, the connector housings are supported in lateral recesses contained in the side edge portions of the printed circuit board by a rear wall having edge portions that project laterally outwardly beyond the edge profile of the printed circuit board. Furthermore, the connector housing may include clip fastening means for clipping the housings to the printed circuit board. A front wall containing corresponding recesses is provided that preferably covers the clip fastening means to further rigidly connect the connector housings to the printed circuit board. Preferably, the thickness of the relatively thin connector housing is generally equal to the sum of the thicknesses of the printed circuit board and the front wall (on the order of 6 mm). The length and width dimensions of the front walls are less than the corresponding dimensions of the rear wall.

A further object of the invention is to provide the assembly with top and bottom wall members, thereby to further enclose the printed circuit board. When these top and bottom wall members are integral with or carried by the rear wall, they are connected with the printed circuit board simultaneously with the rear wall. The bottom wall members preferably include integral mounting foot means for mounting the printed circuit connector arrangement as a terminal block on a conventional mounting rail having a hat-shaped cross-sectional configuration.

According to another object of the invention, fastener means are proved for fastening together the rear wall, the printed circuit board, and the front wall. In the preferred embodiment, these fastener means comprise horizontal fastener members that project forwardly through corresponding openings contained in the printed circuit board and the front wall member. If desired, the synthetic plastic components of the completed assembly are heat sealed together, thereby to define a terminal block printed circuit component.

According to an important feature of the invention, the movable conductor connectors are arranged in relatively thin connector housings positioned outside the outer peripheral edge of the printed circuit board, whereby the connector housings are supported to effect electrical engagement between the movable connectors and stationary contacts mounted on the edge of the printed circuit board. In this way, one can in a simple manner assemble a particularly narrowly structured electronics housing with a printed circuit board, preferably in a serial arrangement pattern, because the conductor connections with the conductor connection housings are not arranged on but outside the circumferential rim of the printed circuit board next to the printed circuit board and because at least the conductor connection housings preferably extend all the way into the plane of the printed circuit board.

In a particularly preferred manner, the conductor connection housings extend all the way into the plane of the printed circuit board.

It is also advantageous when the conductor connection housings at any rate, section by section, themselves constitute a part of the electronics housing because that contributes to an even narrower design.

The invention furthermore creates a particularly simple method for the production of an electronics housing that is characterized by the following steps: arrangement of a plurality of connector housings that receive conductor connections laterally with respect to the outer rim of the printed circuit board, and resiliently connecting or permanently soldering the conductor connections via contact areas such as fixed contacts upon the printed circuit board and fashioning a part of at least one sidewall of the electronics housing by arranging the printed circuit board with the conductor connection housings in the electronics housing.

In this way, one can in a simple manner, directly during the actual soldering procedure, arrange a part of the electronics housing itself together on the printed circuit board so that the conductor connections will lie in a well-protected position during the actual further assembly of the electronics housing.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Figure 1:
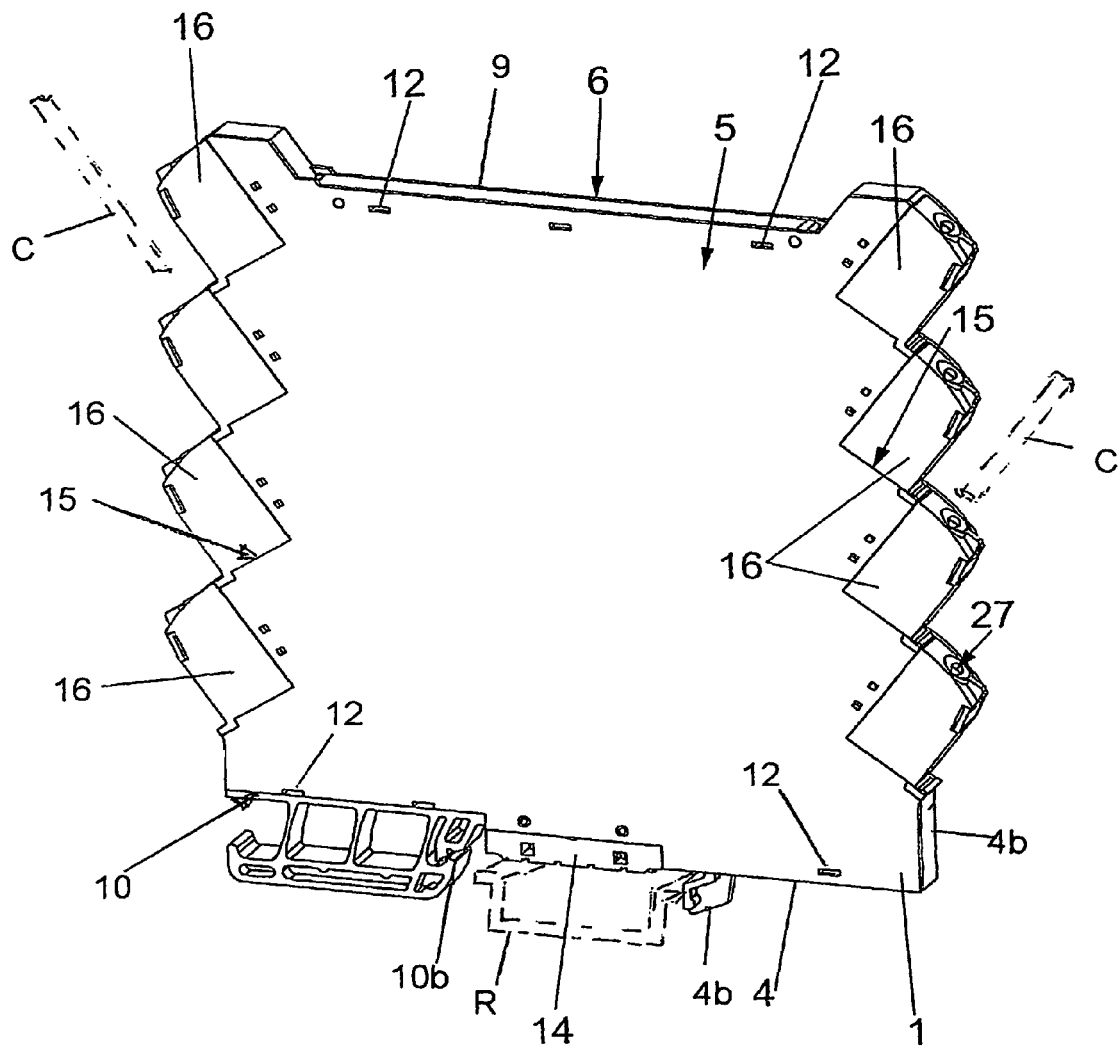
FIG. 1 is a perspective view of the printed circuit board connector arrangement of the present invention.
Figure 2:
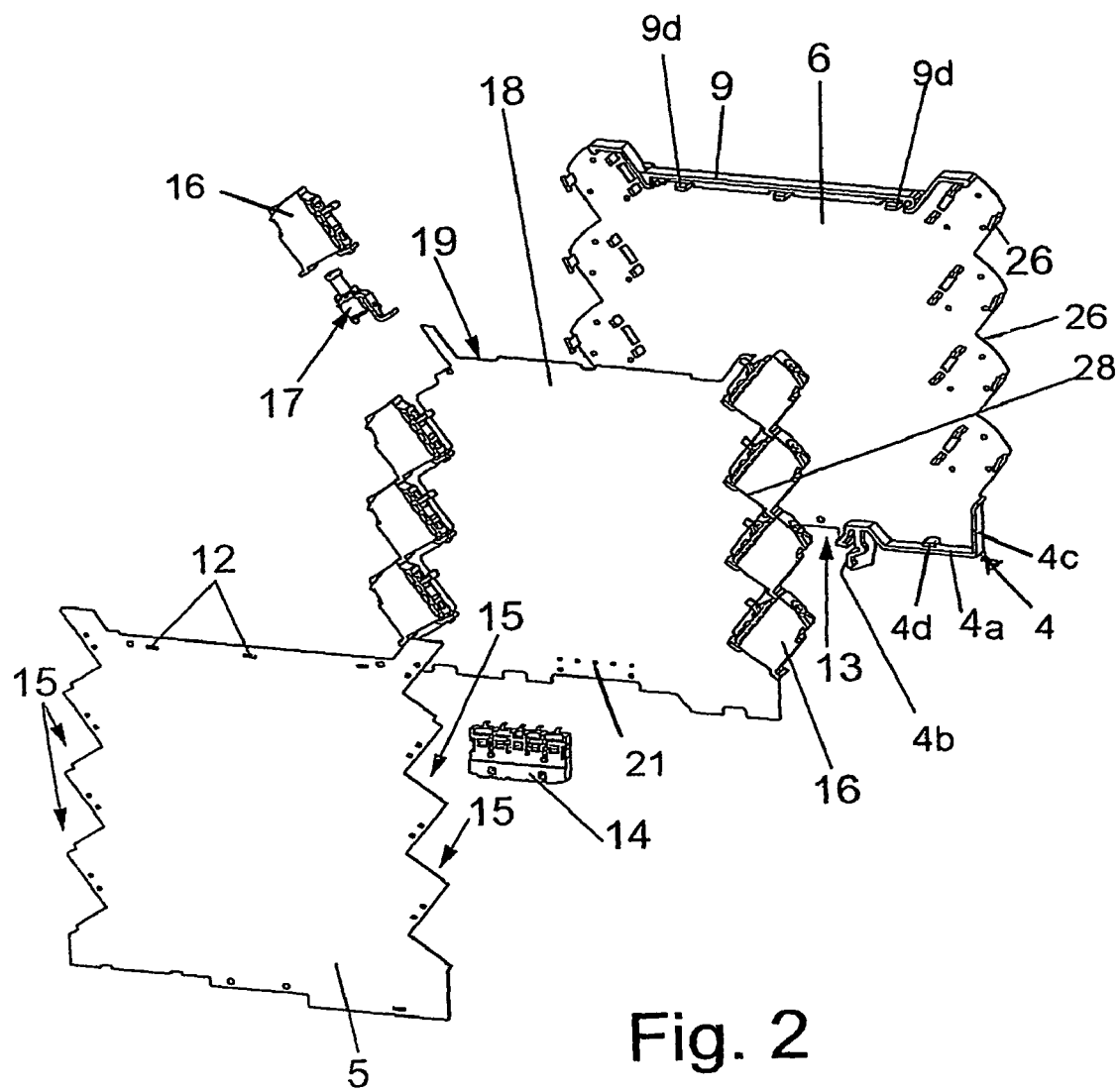
FIG. 2 is an exploded view of the apparatus of FIG. 1.

Referring first more particularly to FIGS. 1 and 2, the printed circuit arrangement 1 has a generally rectangular configuration including a front wall 5, a rear wall 6, a top wall 9, and bottom wall members 4 and 10 separated by the space 13. The printed circuit board 18 is arranged contiguously between and parallel with the front wall 5 and the rear wall 6. Supported on the printed circuit board 18 are a plurality of rectangular relatively-thin connector housings 16 provided with moveable connectors 17 that serve to connect external conductors C with circuits printed on the printed circuit board 18 via fixed contacts 20. The bottom members 4 and 10 are provided with foot portions 4a and 10a that serve to connect the assembly to a mounting rail R having a generally inverted hat-shaped configuration. Mounted on the bottom edge of the assembly in the opening 13 is a bus connector 14 that is adapted for connection with electrical circuits associated with the stationary mounting rail R.

As best shown in FIG. 2, the top wall member 9, the bottom member 4 and the bottom member 10 (not shown) are integral with or supported by the rear wall 6. The printed circuit board 18 has vertical side edges that contain a plurality of recesses 28 that define a sawtooth-type pattern, and the vertical side edges of the front wall 5 contain corresponding recesses 15 that also define a sawtooth-type configuration. The width and height dimensions of the rear wall 6 are greater than those of the front wall 5, whereby the rear wall 6 will support the conductor housing 16 relative to the printed circuit board 18.

Figure 3:
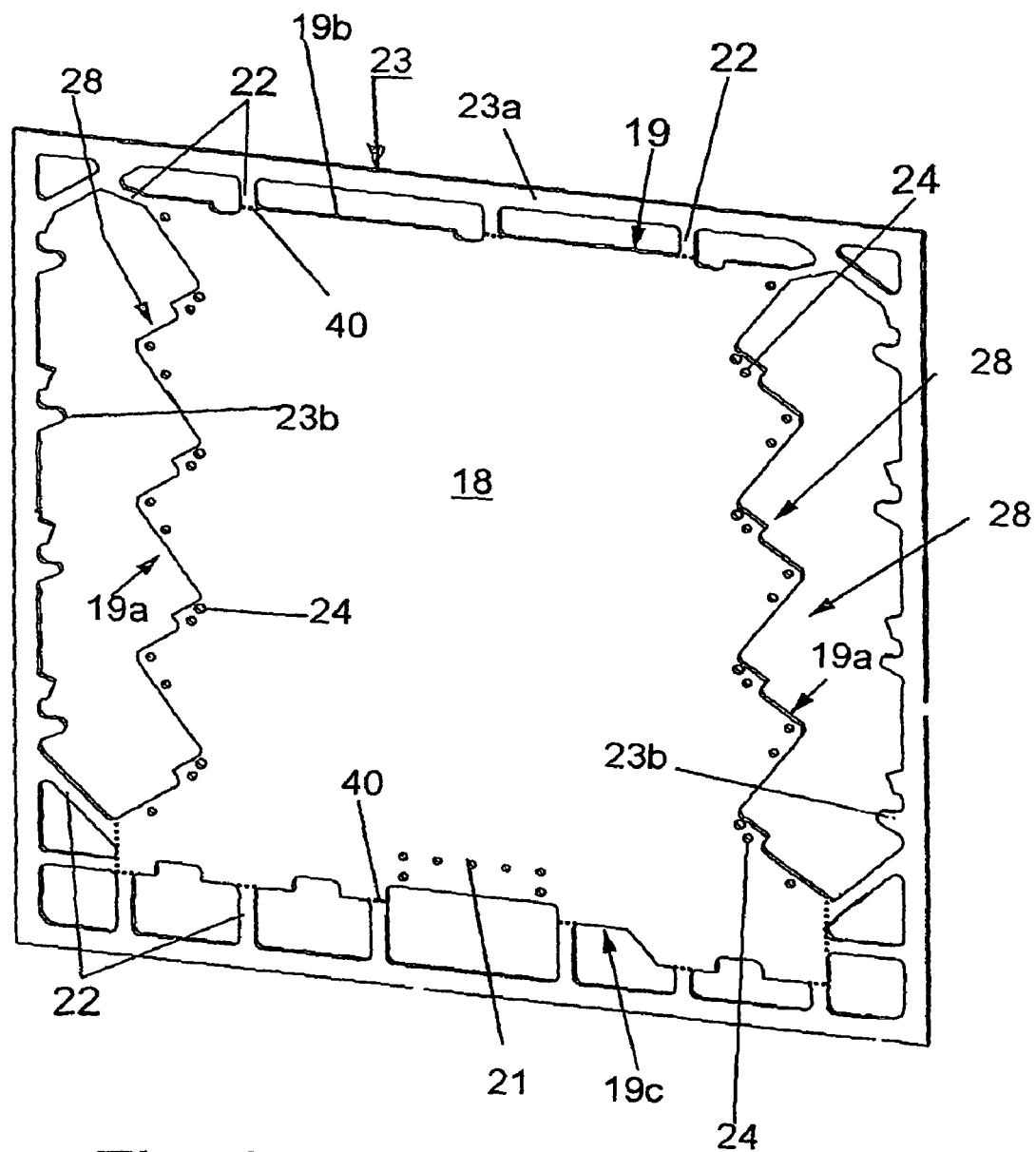
FIG. 3 is a perspective view of the first step of manufacturing the apparatus of FIG. 1, wherein the printed circuit profile is defined by punching a base printed circuit board layer.

Referring now to FIG. 3, as a first step in manufacturing the printed circuit board connector arrangement of FIG. 1, the profile of the printed circuit board 18 is stamped from a base layer 23 such that the edge profile 19 of the printed circuit board 18 is spaced from the border frame 23a by connector portions 22 having frangible lines of separation 40 adjacent the printed circuit board 18.

Figure 4:
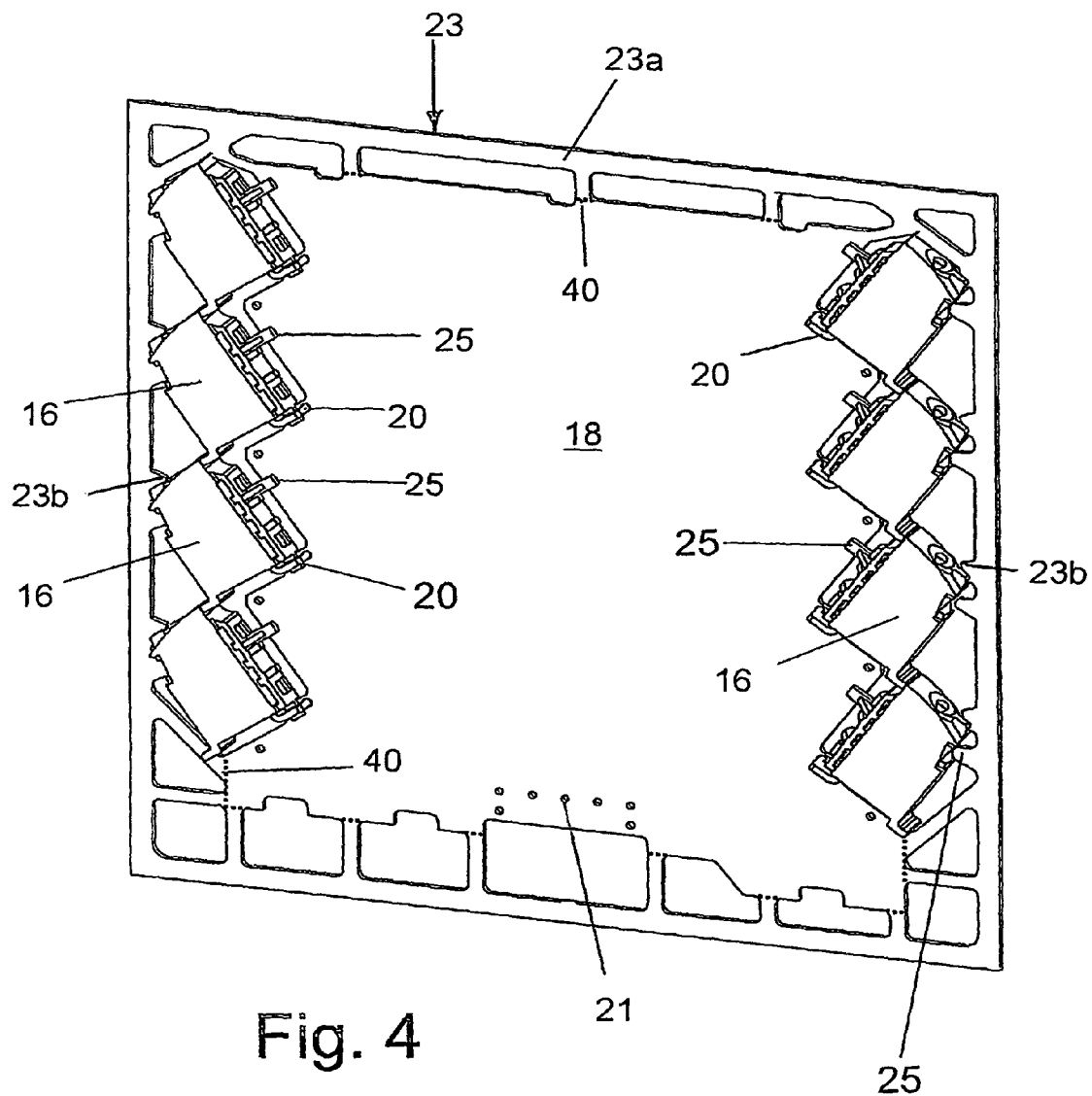
FIG. 4 is a perspective view of the second assembly step of mounting the connector housings on the printed circuit profile of FIG. 3.

According to the second step shown in FIG. 4, a plurality of connector housings 16 are mounted in the recesses 28 defined in the sawtooth edge portion of each side of the printed circuit board. These connector housings 16 are provided with resilient clip devices 25 that serve to clip the connector housings 16 with the adjacent edge portion of the printed circuit board 18. Furthermore, at their opposite corners, the connector housings 16 are initially supported relative to the printed circuit board 18 by projections 23b integral with the border portion 23a of the base layer 23.

Figure 5:
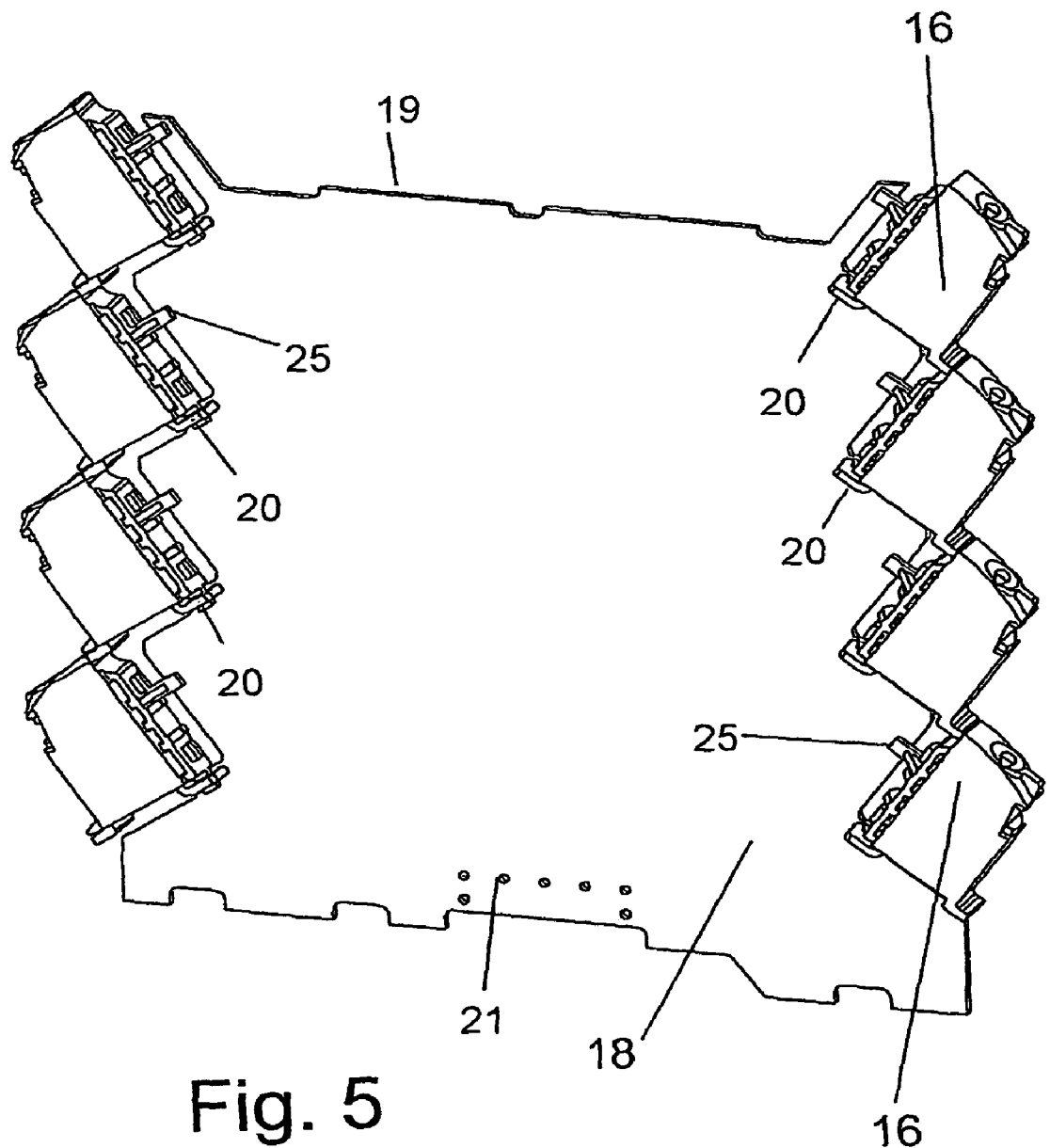
FIG. 5 is a profile of the interim assembly obtained by the third assembly step of removing the border portion from the punched out layer of FIG. 4.

Referring now to FIG. 5, it will be seen that when the frangible lines 40 are broken and the printed circuit board 18 is separated from the border portion 23a of the base layer 23, the connector housings 16 are arranged completely outside the peripheral edge 19 of the printed circuit board. The moveable connectors 17 supported by the connector housings 16 are in electrical engagement with corresponding fixed contacts 20 that are soldered to the respective conductors of the printed circuit board deposited on the base layer of the printed circuit board.

Figure 6:
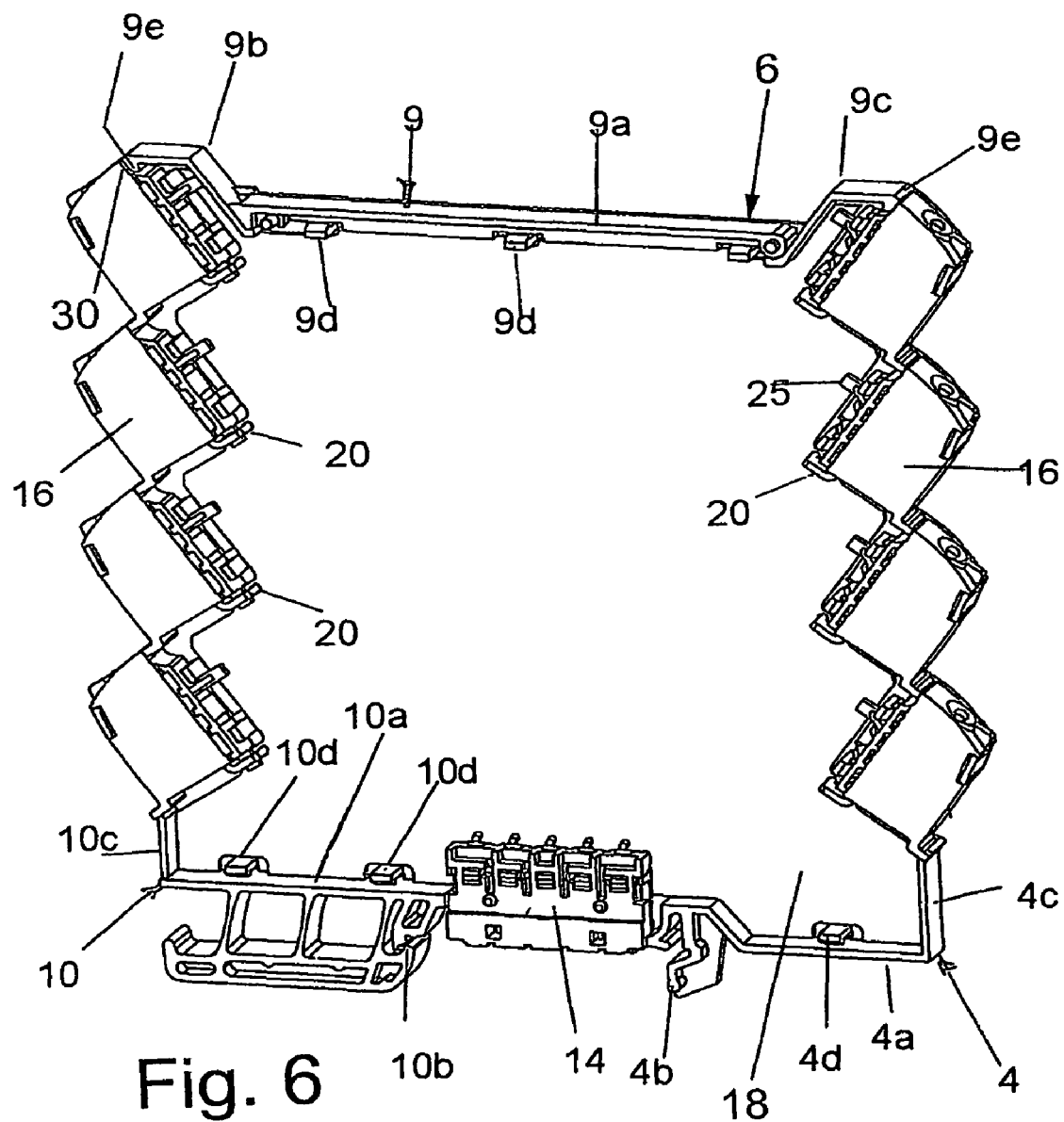
FIG. 6 illustrates the assembly step of mounting the back, bottom and top walls on the interim assembly of FIG. 5.

According to the next assembly step shown in FIG. 6, the rear wall 6 carrying the top wall member 9 and the bottom wall members 4 and 10 is mounted upon the rear surface of the printed circuit board 18. The bottom wall members 4 and 10 include horizontal first portions 4a and 10a, second portions 4b and 10b defining connecting feet for the mounting rail R, vertical corner portions 4c and 10c that extend upwardly to cover the sides of the printed circuit board, and horizontal fastening projections 4d, 10d, and 9d that extend through openings or grooves contained in the printed circuit board 18. The bus connector means 14 is arranged in the opening 13 and is fastened to the openings 21 contained in the printed circuit board. The top wall 9 is of generally U-shaped configuration and includes a horizontal base portion 9a, a pair of leg portions 9b and 9c, a plurality of integral horizontal fastening portions 9d, and a pair of downwardly bent end extremities that extend into correspond supporting recesses 30 contained in the adjacent receptacles housings. Finally, the front wall 5 of FIG. 2 is mounted on the front face of the printed circuit board 18, with the recesses 15 contained in the front wall 5 being positioned opposite the recesses 28 contained in the printed circuit board. The front wall 5 preferably covers the clip means 25 of FIG. 6, thereby to further stabilize the positioning of the connector housing 16 on the printed circuit board assembly. As shown in FIG. 1, the thickness of the printed circuit board plus the thickness of the front wall 5 generally equals the thickness of the relatively narrow rectangular connector housing 16, thereby causing the assembled product to have a very narrow thickness dimension (on the order of about 6 mm).

When the front wall 5 is mounted on the printed circuit board 18 of FIG. 6, the fastening projections 4d, 10d, and 9d on the bottom and top wall members extend through corresponding openings 12 contained in the front wall 5, thereby to fasten the front and rear walls and the printed circuit board 18 together as a unit. Since the front wall 5 and the rear wall 6 are formed from an electrically-insulating synthetic plastic material, the unit may be heat sealed to define a permanent terminal block component suitable for mounting on mounting rails R.

The connector housings 16 are so aligned that the conductor movable contacts 17 (FIG. 2) can, relative to the mounting rail, be wired or unwired diagonally from above. The connector housings 16 here, by way of their interplay, form a serrated outer contour on the narrow sidewalls.

Printed circuit board 18 has a planar level contour that is limited by an outer rim 19. The connector housings 16 of the conductor connections 17 are arranged outside the outer rim 19 of printed circuit board 18. Protruding out of the conductor connection housings 16 are contact areas, such as, for example, contact pins 20 that are welded against or upon printed circuit board 18. In this way, the actual conductor connections 17 are not arranged on the printed circuit board, but rather outside the outer edge 19 laterally next to the printed circuit board 18, which offers the great advantage to the effect that the thickness of the printed circuit board 18 and the thickness of the conductor connections 17 will not add up or will at least not add up completely because the connector housings 16 extend all the way into the plane of the printed circuit board 18.

The arrangement consisting of printed circuit board 18 and the conductor connections 17 with the housings 16 thus will turn out narrower, which makes it possible in the direction of serial alignment to make a particularly narrow electronics housing 1, for example, with a 6-mm grid. Furthermore, the connector housings 16 of printed circuit board 18, at any rate, section by section themselves on one or several sidewalls, constitute a part of the electronics housing 1 as such so that one can make a once-again-narrower electronics housing 1.

During the assembly of the preassembled conductor connection housings with the conductor connections 17, one preferably positions contact areas, such as, for example, contact pins 20 in holes 24 in the printed circuit board 18 or on soldering surfaces upon the printed circuit board 18. This is followed by soldering, preferably by means of an automated soldering method. Manual soldering is conceivable. In this way, one can also attach the bus conductor sections 14 upon the printed circuit board 18 or other functional elements. Additional housing sections of the electronics housing 1 can also be molded directly upon the conductor connection housings 16.

In this way, the conductor connections 17 and thus also the conductor connection housings 16 are fixed upon printed circuit board 18. Then the material bridges 22 can be broken away, or printed circuit board 18 can be taken out of the frame (FIG. 5) and can, as preassembled unit together with the conductor connection housings 16, in this case be placed on the main sidewall 6, whereby the conductor connection housings 16 themselves will constitute portions of the electronics housing 1. Finally, the other main sidewall 5 is assembled, something that completes the assembly of the electronics housing.

In addition, supporting contours 26 on sidewalls 5, 6 can support and stabilize the conductor connection housings 17 on the sidewalls. In this manner, one can assemble a particularly narrowly structured electronics housing 1 with a printed circuit board, preferably in the serial lineup arrangement.

While in accordance with the provisions of the Patent Statutes the preferred forms and embodiments of the invention have been illustrated and described, it will be apparent to those skilled in the art that changes may be made without deviating from the invention described above.

What is claimed is:

1. A printed circuit board connector arrangement, comprising:
   (a) a printed circuit board (18) including a vertical planar generally rectangular base layer formed of electrically-insulating material, said base layer having front and rear surfaces at least one of which carries an electrical printed circuit conductor, and a peripheral edge portion terminating in an edge (19);
   (b) connector means for connecting an external conductor (C) with said printed circuit conductor, including:
      (1) a fixed electrical contact (20) mounted on said printed circuit board adjacent said peripheral edge, said fixed contact being electrically connected with said printed circuit conductor;
      (2) a relatively narrow generally rectangular connector housing (16) formed of an electrically insulating synthetic plastic material, said connector housing being arranged entirely outside said printed circuit board peripheral edge, said printed circuit board edge portion containing a recess (28) in which said connector housing is supported in generally coplanar relation with said printed circuit board; and
      (3) a movable contact (17) carried by said connector housing, said connector housing containing a conductor bore (27) for receiving one end of the external conductor for connection with said movable contact; and
   (c) support means (6, 25) supporting said connector housing relative to said circuit board with said movable contact being in electrical engagement with said fixed contact, said support means including:
      (1) a planar vertical generally-rectangular rear wall (6) connected in parallel contiguous engagement with said printed circuit board rear surface, said rear wall being formed from an electrically-insulating synthetic plastic material and having an edge portion extending outwardly beyond said recess in supporting engagement with said connector housing;
      (2) resilient clip means (25) in clipped engagement with said printed circuit board edge portion; and
      (3) a planar vertical generally-rectangular front wall (5) parallel and contiguous with the front surface of said printed circuit board, said front wall being formed of electrically-insulating synthetic plastic material and having width and height dimensions that are less than those of said rear wall, said front wall containing a recess (15) opposite said printed circuit board recess, said connector housing extending also into said front wall recess, the thickness of said connector housing being generally equal to the sum of the thicknesses of said printed circuit board and said front wall.

2. A printed circuit board connector arrangement as defined in claim 1, wherein said front wall extends over said clip means, thereby to maintain said clip means in engagement with said printed circuit board.

3. A printed circuit board connector arrangement as defined in claim 1, and further including horizontal bottom wall means (4, 10) connected with and extending at least partially across the bottom edges of said rear wall, said printed circuit board, and said front wall.

4. A printed circuit board connector arrangement as defined in claim 3, wherein said bottom wall means includes foot means (4b, 10b) for fastening said printed circuit board arrangement to a support rail.

5. A printed circuit board connector arrangement as defined in claim 4, wherein said bottom wall means comprises a pair of horizontal foot members (4, 10) that are separated by an opening (13) opposite the support rail; and further including bus connector means (14) arranged in said opening for connecting a circuit on said printed circuit board with said support rail.

6. A printed circuit board connector arrangement as defined in claim 3, and further including horizontal top wall means (9) connected with and extending across the upper edges of said rear wall, said printed circuit board, and said front wall.

7. A printed circuit board connector arrangement as defined in claim 6, and further including fastening means for fastening together said rear wall, said printed circuit board and said front wall.

8. A printed circuit board connector arrangement as defined in claim 6, wherein said top and bottom walls comprise top (9) and bottom (4, 10) wall members mounted on said rear wall; and further wherein said fastening means comprising at least one horizontal fastening projection (9d, 4d, 10d) extending from at least one of said wall members through corresponding openings (12) contained in said printed circuit member and said front wall.

9. A printed circuit board connector arrangement as defined in claim 8, wherein
top (9) and bottom (4, 10) members are integral with said rear wall.

10. A printed circuit board connector arrangement as defined in claim 1, wherein the vertical side edge portions of said printed circuit board and said front wall contain a plurality of corresponding vertically-arranged aligned first (28) and second (15) recesses; and further including a plurality of said connector housings (16) mounted in said recesses, respectively, said connector housings having movable contacts in electrical engagement with corresponding fixed circuit conductor contacts (20) on said printed circuit board, respectively.

11. A printed circuit board connector arrangement as defined in claim 10, wherein said printed circuit board and front wall recesses (28, 15) define a sawtooth configuration in each of the vertical side edges of said printed circuit board and said front wall, the longitudinal axes of said connector housings on each side of the vertical axis of said printed circuit board being parallel and angularly inclined relative to said vertical axis.

12. A printed circuit board connector arrangement as defined in claim 11, wherein said rear wall contains a plurality of third recesses (26) arranged in a sawtooth pattern offset from said first and second recesses, thereby to afford downward angular access to said connector housing conductor bores by the external conductors, respectively.

13. A printed circuit board connector arrangement as defined in claim 5, wherein said foot members comprise corner members having vertical side wall portions (4b, 10b) that extend up the sides of the arrangement.

* * * * *